United States Patent
Sowlati et al.

(10) Patent No.: US 7,355,463 B2
(45) Date of Patent: *Apr. 8, 2008

(54) LOOP FILTER INTEGRATION IN PHASE-LOCKED LOOPS

(75) Inventors: Tirdad Sowlati, Irvine, CA (US); Edward Youssoufian, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/439,060

(22) Filed: May 23, 2006

(65) Prior Publication Data

US 2006/0208778 A1   Sep. 21, 2006

Related U.S. Application Data

(63) Continuation of application No. 10/858,444, filed on Jun. 1, 2004, now Pat. No. 7,091,759.

(51) Int. Cl.
*H03L 7/06* (2006.01)
*H00K 5/00* (2006.01)

(52) U.S. Cl. ............... 327/157; 327/148; 327/558

(58) Field of Classification Search ............. 327/552, 327/558, 156–158, 147–149
See application file for complete search history.

(56) References Cited

U.S. PATENT DOCUMENTS

| | | | |
|---|---|---|---|
| 4,167,711 A * | 9/1979 | Smoot | 331/17 |
| 4,774,479 A * | 9/1988 | Tateishi | 331/1 A |
| 5,095,288 A | 3/1992 | Dent | 331/17 |
| 5,180,993 A * | 1/1993 | Dent | 331/16 |
| 5,424,689 A * | 6/1995 | Gillig et al. | 331/17 |
| 6,011,822 A | 1/2000 | Dreyer | 375/376 |
| 6,215,362 B1 | 4/2001 | Feng et al. | 331/17 |
| 6,600,351 B2 | 7/2003 | Bisanti et al. | 327/157 |
| 6,611,176 B1 | 8/2003 | Goldman | 331/17 |
| 6,826,248 B2 * | 11/2004 | Kushibe | 375/376 |
| 6,995,607 B2 * | 2/2006 | Dosho et al. | 327/558 |
| 7,078,948 B2 * | 7/2006 | Dosho | 327/157 |
| 2005/0134391 A1 | 6/2005 | Kimura et al. | 331/16 |

OTHER PUBLICATIONS

Craninckx, et al.; A Fully Integrated CMOS DCS-1800 Frequency Synthesizer; IEEE Journal of Solid-State, Circuits, vol. 33, No. 12, Dec. 1998; pp. 2054-2065.

Lo, et al.; A 1.5 V 900-MHz Monolithic CMOS Fast-Switching Frequency Synthesizer for Wireless Applications; 2000 Symposium on VLSI Circuits Digest of Technical Papers; pp. 238-241.

Koo, et al.; A Fully-Integrated CMOS Frequency Synthesizer with Charge-Averaging Charge Pump and Dual-Path Loop Filter for PCS-and Cellular-CDMA Wireless Systems; 2001 Symposium on VLSI Circuits Digest of Technical Papers; pp. 43-45.

Larsson; An Offset-Cancelled CMOS Clock-Recovery/Demux with a Half-Rate Linear Phase Detector for 2.5Gb/s Optical Communication; 2001 IEEE International Solid-State Conference.

* cited by examiner

*Primary Examiner*—Dinh T. Le
(74) *Attorney, Agent, or Firm*—Thomas, Kayden, Horstemeyer & Risley, LLP

(57) ABSTRACT

A phase-locked loop and method are disclosed. One method embodiment includes providing a dual-path filter of a phase-locked loop, the dual-path filter consisting of passive components, and summing control signals in the dual-path filter using the passive components.

10 Claims, 6 Drawing Sheets

LOOP FILTER INTEGRATION IN PHASE-LOCKED LOOPS

CROSS-REFERENCE TO RELATED APPLICATION

This application is a continuation of U.S. utility application entitled, "LOOP FILTER INTEGRATION IN PHASE-LOCKED LOOPS," having Ser. No. 10/858,444, filed Jun. 1, 2004, now U.S. Pat. No. 7,091,759 which is entirely incorporated herein by reference.

BACKGROUND OF THE INVENTION

1. Field of the Invention

This invention is generally related to frequency synthesizers. More particularly, the invention relates to phase-locked loops that include loop filters integrated entirely on a semiconductor chip.

2. Related Art

Frequency synthesizers are regularly employed in communication transceivers used in numerous types of communication systems and communication technologies. The frequency synthesizer typically includes a phase-locked loop comprising an oscillator, such as a voltage-controlled oscillator, a loop filter, and a phase-frequency detector. A problem with conventional phase-locked loop designs is that the conventional loop filter consists of capacitors that often consume too much space to practically allow integration on a chip.

FIG. 1 is a block diagram that illustrates an example phase-locked loop (PLL) 160. The phase-locked loop 160 includes a phase-frequency detector (PFD) 162, a charge pump (CP) 164, a loop filter 166, a voltage-controlled oscillator (VCO) 168, and a divide-by-N (/N) module 170. Note that N can be a fractional or integer value. Although shown using a divide-by-N module 170, the phase-locked loop 160 can also be implemented using a mixer in place of the divide-by-N module 170. The use of a mixer in place of the divide-by-N module provides an architecture that is known in the industry as an "offset-phase-locked loop" or "translational loop." The phase-locked loop 160 locks the output signal of the VCO 168 to a clock signal (designated reference signal, Vref) that is N times lower in frequency than the VCO output signal.

The PFD 162 controls the frequency of the output signal of the VCO 168. The PFD 162 of the phase-locked loop 160 receives the divided VCO output signal from the divide-by-N module 170 at one input terminal and compares the phase and frequency of the divided VCO output signal to the reference signal, Vref, received at the other input terminal. Based on the comparison of the divided VCO output signal to the reference signal, the PFD 162 generates control signals to the charge pump 164, which generates a control signal (e.g., current signal) that is low-pass filtered by the loop filter 166 and then provided to the VCO 168. The filtered control signal output from the loop filter 166 is received by a varactor (not shown) in the VCO 168. The filtered control signal from the loop filter 166 tunes the varactor by changing the voltage across the varactor, thereby changing the frequency (and the phase) of the output signal of the VCO 168. The output signal of the VCO 168 is then divided down by the divide-by-N module 170 for comparison with the lower clock frequency, Vref, at the PFD 162 to adjust to the same phase and frequency.

The loop filter 166 generally comprises an integrating capacitor 174, with a value generally in the range of a few hundred pico-Farads for UHF (ultra-high-frequency) phase-locked loops. The integrating capacitor 174 is configured in parallel with a series R-C combination (i.e., a resistor 171-capacitor 173 series arrangement), which creates a low-frequency zero in the frequency response of the loop filter 166. A low-frequency zero can improve stability of the phase-locked loop 160. One well-known mechanism for creating a low-frequency zero is by using a large capacitor (e.g., capacitor 173 is typically in the range of a few nano-Farads). The integrating capacitor 174 is also in parallel with another R-C combination (resistor 172 and capacitor 175), which attenuates high-frequency signal components that are output from the charge pump 164 and creates a high-frequency pole in the frequency response of the loop filter 166. These resistor-capacitor networks of the loop filter 166 pose integration difficulties with the rest of the phase-locked loop components because of the large amount of space consumed to realize the needed capacitance (e.g., in the few nano-Farads range).

Several attempts at integrating a loop filter onto a chip are known in the art. One example implementation is illustrated in FIG. 2A. FIG. 2A is a block diagram of an example phase-locked loop (PLL) 260 configured with what is known in the art as a dual-path loop filter 266. This circuit is described in further detail in "A 1.5V 900 MHz Monolithic CMOS Fast-Switching Frequency Synthesizer For Wireless Applications," by C. W. Lo, H. C. Luong, in the 2000 Symposium on VLSI Circuit Digest of Technical papers, pp. 238-241, herein incorporated by reference. The phase-locked loop 260 includes a phase-frequency detector (PFD) 262, a charge pump (CP) system 264 comprising charge pump modules 269a and 269b, a loop filter 266, a voltage-controlled oscillator (VCO) 268, and a divide-by-N (/N) module 270. The general principles of operation for the phase-locked loop 260 are similar to that described for the phase-locked loop 160 of FIG. 1. However, in the example phase-locked loop 260, the charge pump system 264 includes two modules 269a and 269b that provide current signals $I_{CP1}$ and $I_{CP2}$ on output connections 280 and 282, respectively. Connections 280 and 282 are a point of origination for dual-paths of the loop filter 266. The current signals from each module 269a and 269b are a ratio of each other (e.g., they both increase or decrease based on the signals from the PFD 262). Generally, the current values at connections 280 and 282 are different (e.g., 10 microamperes versus 100 microamperes, respectively). The use of dual-paths carrying current signals that are a ratio of each other provides a mechanism to obtain low-frequency zeroes for the frequency response of the loop filter 266 while enabling a reduction in the size of the capacitors of the loop filter 266 to conserve chip area.

The loop filter 266 comprises R-C networks configured as an integrator 284 in the path corresponding to connection 280, and a low-pass filter (LPF) 286 in the path corresponding to connection 282. Signals from the integrator 284 and the LPF 286 are provided on separate connections 290 and 291 to the VCO 268, which is shown in further detail in FIG. 2B.

The VCO 268 includes, among other components, back-to-back varactors 202 and 204. Varactor 202 includes back-to-back, reverse-biased diodes 206 and 208, and varactor 204 includes back-to-back, reverse-biased diodes 210 and 212. The output of the integrator 284 (FIG. 2A) is provided over connection 290 to node 218 corresponding to varactor 202. The output of the LPF 286 (FIG. 2A) is provided over connection 291 to node 220 corresponding to varactor 204. Diodes 206, 208, 210, and 212 are weighted to enable summation of the outputs of the integrator 284 and LPF 286 in the capacitance domain. Typically, one varactor set will have a $K_{vco}$ (i.e., the control characteristic of a VCO in frequency per voltage) that is scaled in comparison to the other set. For example, varactor 202 may have a $K_{vco}$ of approximately 10 mega-Hertz (MHz) per volt, whereas the other varactor 204 may be ten times less in $K_{VCO}$ value. Thus, the varactors 202 and 204 of the VCO 268 combine the different filtering characteristics of the loop filter paths, enabling smaller capacitance values for the loop filter 266 than those utilized in the loop filter 166 (FIG. 1) for the phase-locked loop 160 of FIG. 1. Yet, the output signal of the phase-locked loop 260 approximates the output signal provided in the phase-locked loop 160.

Similar dual-path solutions have been disclosed. In J. Craninckx and M. Steyaert's article, "A Fully-Integrated CMOS DCS-1800 Frequency Synthesizer," IEEE Journal of Solid State Circuit (JSSC), December 1998, pp. 2054-2065, herein incorporated by reference, a dual-path loop filter is used to create a low-frequency zero in the frequency response of the loop filter by adding an integrator path and a low-pass filter path. Each of these paths has a separate charge pump module, as shown in FIG. 2A. This implementation is disclosed using two active devices to do the summation of the two paths. However, the active components can create extra noise.

Another solution is described in the 2001 Symposium on VLSI Circuits Digest of Technical Papers, pp. 43-46, entitled, "A Fully-Integrated CMOS Frequency Synthesizer With Charge-Averaging Charge Pump And Dual-Loop Path Filter for PCS and Cellular CDMA Wireless Systems," by Y. Yoo, et al., herein incorporated by reference. In this implementation, a unity gain buffer is used to combine the two paths, thus using only a single active device.

Although some of these implementations facilitate the integration on-chip of loop filters by reducing the capacitance and consequently the area consumed by the capacitive device, it would be desirable to provide a phase-locked loop having a loop filter integrated on chip and having reduced complexity and improved noise performance while not significantly altering the loop transfer characteristics.

SUMMARY

Embodiments of a phase-locked loop and method of operation are disclosed. One method embodiment includes the steps of providing a dual-path filter of a phase-locked loop, the dual-path filter consisting of passive components, and summing control signals in the dual-path filter using the passive components.

Related devices, systems, and methods of operation are also provided. Other systems, methods, features, and advantages of the invention will be or become apparent to one with skill in the art upon examination of the following figures and detailed description.

BRIEF DESCRIPTION OF THE FIGURES

Preferred embodiments of a phase-locked loop and corresponding methods of operation can be better understood with reference to the following figures. The components within the figures are not necessarily to scale, emphasis instead being placed upon clearly illustrating the principles of operation of a phase-locked loop. Moreover, in the figures, like reference numerals designate corresponding parts throughout the different views.

DETAILED DESCRIPTION

Preferred embodiments of a phase-locked loop comprising a loop filter that can be integrated on-chip with other phase-locked loop components are disclosed. The phase-locked loop embodiments described herein utilize a dual-path arrangement that provides charge pump control signals that are a ratio of each other, and comprise passive components (e.g., resistor(s), capacitor(s), etc.) to do the summation of dual-paths in a loop filter, thus reducing noise problems that are often characteristic of active components (e.g., operational amplifiers) used to perform such summation functions in conventional systems. Loop filters described herein will also be referred to as dual-path filters. Further, the phase-locked loop embodiments do not need two sets of weighted back-to-back varactors (e.g., one for the integrator path, the other for the LPF path as shown in FIG. 2B), since a weighted summation can easily be done by the ratio of the passive components (e.g., resistors and capacitors) of a loop filter. In one embodiment, current through a resistor in a loop filter is scaled up (e.g., increased) and current through a capacitor in the loop filter is scaled down (e.g., decreased) to provide a low-frequency zero without consuming excessive chip area.

Figure 3:
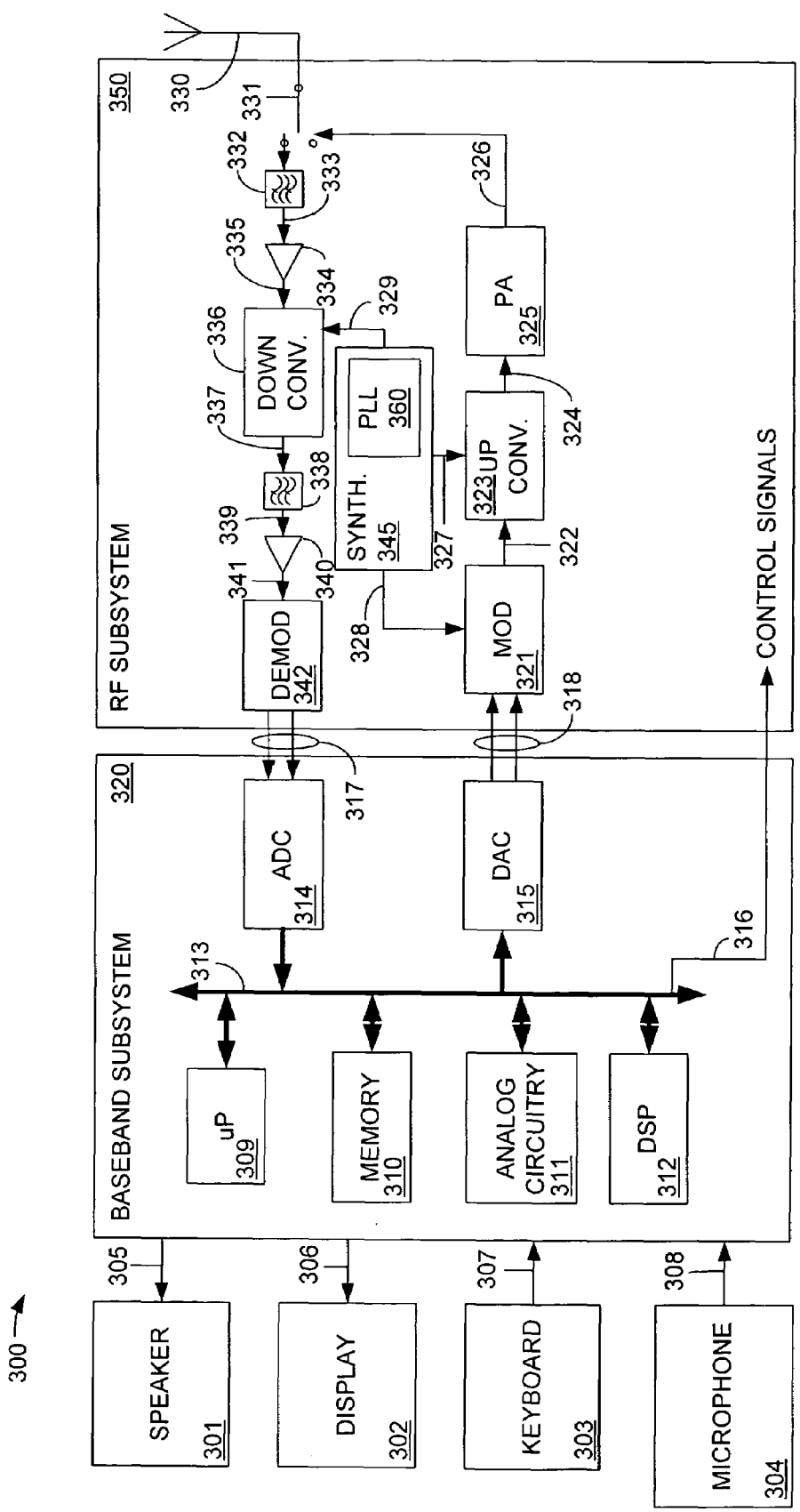
FIG. 3 is a block diagram illustrating an example implementation for a phase-locked loop according to an embodiment of the invention.

As a brief overview, an example implementation for a phase-locked loop is described in association with FIG. 3. The phase-locked loop will be described in the context of a portable transceiver using a double-downconversion receiver (e.g., downconvert from radio-frequency (RF) to intermediate frequency (IF), and then from IF to baseband), with the understanding that transceivers using other receiver architectures such as direct conversion or low/zero-IF can similarly be used. Further, two embodiments of the phase-locked loop of FIG. 3 are described in association with FIGS. 4 and 5. Although described with particular reference to a portable transceiver, the phase-locked loop embodiments of FIGS. 4 and 5, among other embodiments, can be implemented in substantially any system that provides frequency control for a synthesizer or like-systems and/or devices.

FIG. 3 is a block diagram of a simplified, example portable transceiver 300 that illustrates an example implementation for a phase-locked loop (PLL) 360 according to an embodiment of the invention. The portable transceiver 300 generally includes a speaker 301, display 302, keyboard 303, and microphone 304, all connected to a baseband subsystem 320. In a particular embodiment, the portable transceiver 300 can be, for example but not limited to, a portable telecommunication device such as a mobile/cellular-type telephone. The speaker 301 and display 302 receive signals from the baseband subsystem 320 via connections 305 and 306, respectively, as known to those skilled in the art. Similarly, the keyboard 303 and microphone 304 supply signals to the baseband subsystem 320 via connections 307 and 308, respectively.

The baseband subsystem 320 includes a microprocessor (µP) 309, memory 310, analog circuitry 311, and a digital signal processor (DSP) 312 in communication via a bus 313. The bus 313, although shown as a single bus, may be implemented using multiple busses connected as necessary among the subsystems within the baseband subsystem 320. The microprocessor 309 and memory 310 provide the signal timing, processing and storage functions for the portable transceiver 300. The analog circuitry 311 provides the analog processing functions for the signals within the baseband subsystem 320. The baseband subsystem 320 provides control signals to a radio frequency (RF) subsystem 350 via connection 316. Although shown as a single connection 316, the control signals may originate from the DSP 312 and/or from the microprocessor 309, and are supplied to a variety of points within the RF subsystem 350. It should be noted that, for simplicity, only the basic components of the portable transceiver 300 are illustrated herein.

The baseband subsystem 320 also includes, in one embodiment, an analog-to-digital converter (ADC) 314 and a digital-to-analog converter (DAC) 315. The ADC 314 and DAC 315 also communicate with the microprocessor 309, memory 310, analog circuitry 311, and the DSP 312 via the bus 313. The DAC 315 converts the digital communication information within the baseband subsystem 320 into an analog signal for transmission to the RF subsystem 350 via connection 318. Connection 318, shown as two directed arrows, includes the information that is to be transmitted by the RF subsystem 350 after conversion from the digital domain to the analog domain.

The RF subsystem 350 includes a modulator 321 which, after receiving a frequency reference signal (also called a "local oscillator" signal or "LO") from the synthesizer 345 via connection 328, modulates the received analog information and provides a modulated signal via connection 322 to an upconverter 323. In a constant envelope modulation methodology, the modulated transmit signal generally includes only phase information. The upconverter 323 also receives a frequency reference signal from the synthesizer 345 via connection 327. The synthesizer 345 determines the appropriate frequency to which the upconverter 323 upconverts the modulated signal on connection 322.

The synthesizer 345 also includes the phase-locked loop 360 according to an embodiment of the invention. The synthesizer 345 uses the phase-locked loop 360 to precisely control the phase and frequency of the output signal of an oscillator (not shown), such as a voltage-controlled oscillator (VCO) disposed in the synthesizer 345.

The upconverter 323 supplies the modulated signal via connection 324 to a power amplifier 325. The power amplifier 325 amplifies the modulated signal on connection 324 to the appropriate power level for transmission via connection 326 to antenna 330. Illustratively, a switch 331 controls whether the amplified signal on connection 326 is transferred to antenna 330 or whether a received signal from antenna 330 is supplied to a receive filter 332. The operation of the switch 331 is controlled by a control signal from the baseband subsystem 320 via connection 316. Alternatively, the switch 331 may be replaced by a filter pair (e.g., a duplexer) that allows simultaneous passage of both transmit signals and receive signals, as is known in the art.

A signal received by the antenna 330 will be directed to the receive filter 332. The receive filter 332 filters the received signal and supplies the filtered signal on connection 333 to a low-noise amplifier (LNA) 334. The receive filter 332 is a band pass filter, which passes all channels of the particular cellular system in which the portable transceiver 300 is operating. As an example, for a 900 MHz (mega-Hertz) GSM (Global System for Mobile Communication) system, the receive filter 332 would pass all frequencies from 925 MHz to 960 MHz, covering all 175 contiguous channels of approximately 200 kHz (kilo-Hertz) each. One purpose of this filter 332 is to reject all frequencies outside the desired region. The LNA 334 amplifies the relatively weak signal on connection 333 to a level at which the downconverter 336 can translate the signal from the transmitted frequency to an intermediate frequency (IF). Alternatively, the functionality of the LNA 334 and the downconverter 336 can be accomplished using other elements, such as a low-noise block downconverter (LNB), among others.

The downconverter 336 receives a frequency reference signal (or "local oscillator" signal or "LO") from the synthesizer 345 (e.g., via the phase-locked loop 360), via connection 329, which signal instructs the downconverter 336 as to the proper frequency to downconvert the signal received from the LNA 334 via connection 335. The downconverted frequency is called the intermediate frequency or IF. The downconverter 336 sends the downconverted signal via connection 337 to a channel filter 338, also called an "IF filter." The channel filter 338 filters the downconverted signal and supplies it via connection 339 to an amplifier 340. The channel filter 338 selects the one desired channel and rejects all others. Using the GSM system as an example, only one of the 175 contiguous channels is desired to be processed.

After all channels are passed by the receive filter 332 and downconverted in frequency by the downconverter 336, only the one desired channel will appear precisely at the center frequency of the channel filter 338. The synthesizer 345, by controlling the local oscillator operating frequency supplied on connection 329 to the downconverter 336, determines the selected channel. The amplifier 340 amplifies the received signal and supplies the amplified signal via connection 341 to a demodulator 342. The demodulator 342 recovers the transmitted analog information and supplies a signal representing this information via connection 317 to the ADC 314. The ADC 314 converts these analog signals to a digital signal at baseband frequency and transfers the signal via the bus 313 to the DSP 312 for further processing. Alternatively, the downconverted carrier frequency (IF frequency) at connection 337 may be 0 Hz, in which case the receiver is referred to as a "direct conversion receiver." In such a case, the channel filter 338 is implemented as a low-pass filter, and the demodulator 342 may be omitted.

Figure 4:
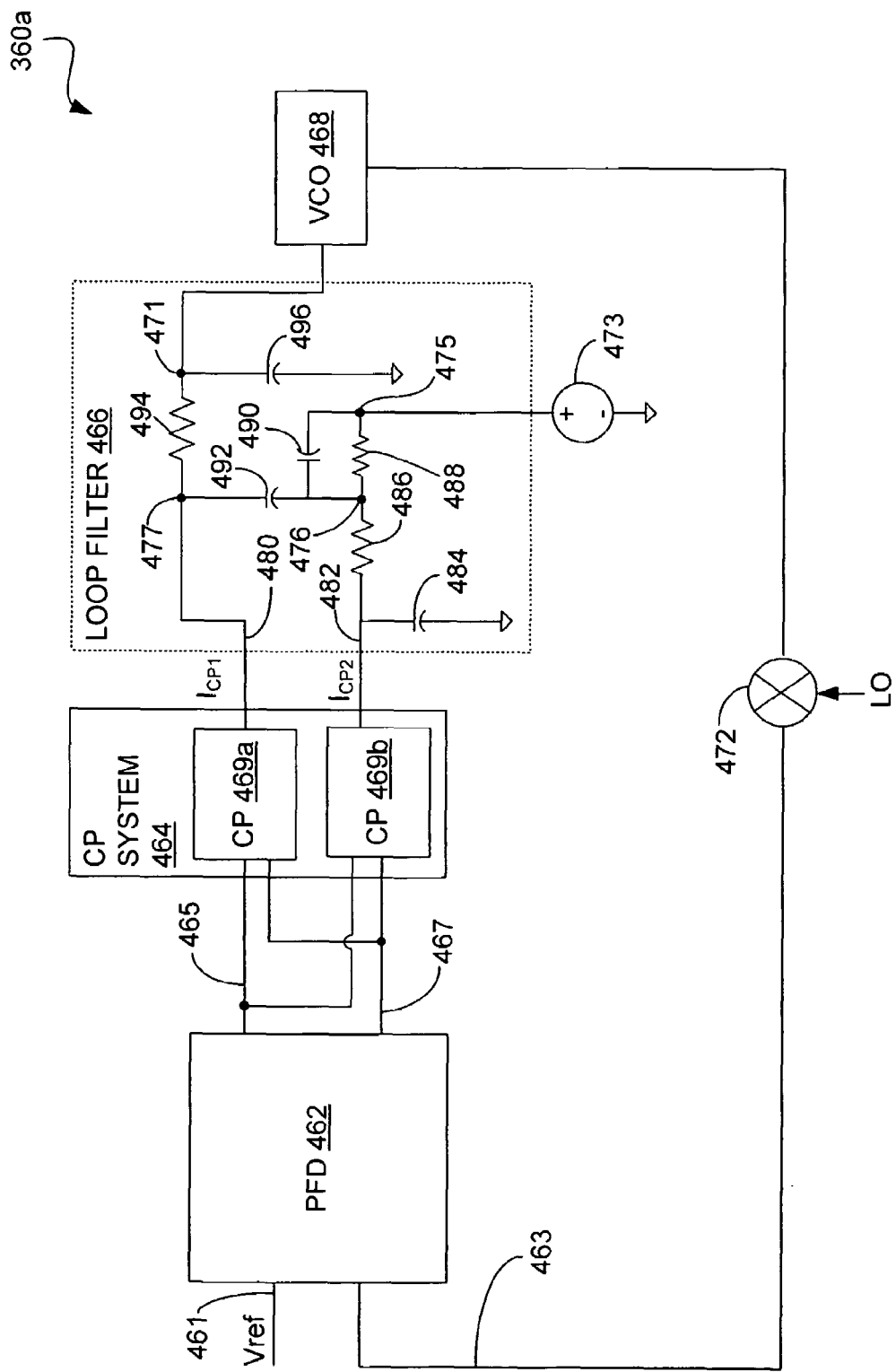
FIG. 4 is a block diagram illustrating one embodiment of the phase-locked loop of FIG. 3.

FIG. 4 illustrates a block diagram of one embodiment of the phase-locked loop 360 shown in FIG. 3. The phase-locked loop 360a includes a phase-frequency detector (PFD) 462, a charge pump (CP) system 464 comprising charge pump modules 469a and 469b, a loop filter 466, a controllable oscillator such as a voltage-controlled oscillator (VCO) 468, and a mixer 472. Note that in some embodiments, a divide-by-N module (where N can be a fractional or integer number) can be used in place of the mixer 472. The mixer 472 receives the LO signal derived from the same source as Vref (described below) but at a different frequency. The mixer 472 downconverts the frequency of the signal received from the VCO 468 and provides it over connection 463 to one input terminal of the PFD 462. For example, the LO signal may be at 1 giga-Hertz (GHz). The signal from the VCO 468 can be at 900 MHz, which is downconverted by the mixer 472 to 100 MHz. Thus, the signal at the PFD 462 (on connection 463) from the mixer 472 is at 100 MHz. In alternative embodiments, the controllable oscillator may be substantially any type of oscillator and need not be voltage-controlled, and/or the PFD 462 can be substituted with a phase-detector or frequency detector, as would be understood by one having ordinary skill in the art.

The PFD 462 receives a reference clock signal (Vref) at connection 461 and a downconverted VCO output signal from the mixer 472 at connection 463. The Vref signal can be derived from a crystal oscillator (not shown) that is a stand-alone device or integrated on the synthesizer 345 (FIG. 3). The Vref signal, in one embodiment, can be controlled by the baseband subsystem 320 (FIG. 3) via control connection 316 (FIG. 3). The PFD 462 performs a frequency and phase comparison between the two input signals on connections 461 and 463, and provides a pulse-up signal at one of the nodes 465 or 467 disposed between the PFD 462 and the charge pump system 464. For example, a pulse-up signal can be provided at node 465, and then provided to charge pump modules 469a and 469b. Similarly, a pulse-down signal can be provided to node 467, and then provided to charge pump modules 469a and 469b. The combination of the pulse-up signal and pulse-down signals from the PFD 462 provide an indication to each charge pump module 469a and 469b of the charge pump system 464 whether to increase the frequency of its output control signals (e.g., current signal, $I_{CP1}$ and current signal, $I_{CP2}$) or to decrease the frequency of its output control signals. The current signals $I_{CP1}$ and $I_{CP2}$ are thus a ratio of each other (i.e., the current signals increase together or decrease together), and may vary in magnitude (e.g., $I_{CP2}$ can be ten times greater than $I_{CP1}$).

The charge pump modules 469a and 469b of the charge pump system 464 convert the digital pulses received via nodes 465 and 467 to current signals, $I_{CP1}$ and $I_{CP2}$, which are provided to the loop filter 466 via connections 480 and 482, respectively. In general, the loop filter 466 has a dual-path topology comprising an integrator path and a low-pass filter path. The summation of the integrator path and the low-pass filter path is accomplished by using passive components. The integrator path, in one embodiment, comprises a resistor 494 and two series capacitors 492 and 490. Resistors 486 and 488 in parallel with capacitor 484 comprise the LPF path. The summation of the two paths is done by connecting resistor 488 to capacitor 490 at node 476. The summation is a weighted sum which is used to position (e.g., location in the frequency domain) the zero in the frequency response of the loop filter 466. As an example, the capacitance ratio of capacitor 492 over capacitor 490 can be about 9. The resistance ratio of resistor 486 over resistor 488 can be about 6. The combined output is taken from node 477 disposed between capacitor 492 and resistor 494, and then the signal is provided through the high-frequency pole created by the resistor 494-capacitor 496 arrangement. The resistor 494-capacitor 496 arrangement attenuates the high-frequency signal components in the loop filter 466. From node 471, the signal is provided to the VCO 468. The extra pole created by resistor 494-capacitor 496 arrangement has a negligible effect on the frequency band of interest. In some embodiments, the resistor 494-capacitor 496 combination can be omitted, such as in implementations where there are no high-frequency signal components and/or to simplify the loop filter circuitry.

Resistor 488 and capacitor 490 share node 475, which in one embodiment, is also connected to voltage source 473. The voltage source 473 can provide a bias voltage at a voltage value selected from a range between the supply voltage and ground, and is typically provided at a value midway between these two values. In some embodiments, the bias voltage can be provided through a divider network, a bias generator, or other mechanisms. In some embodiments, the voltage source may be replaced with a connection to ground, although design considerations in such implementations may include addressing the voltage potential (e.g., possibly zero) at connection 482 for steady-state conditions.

Figure 1:
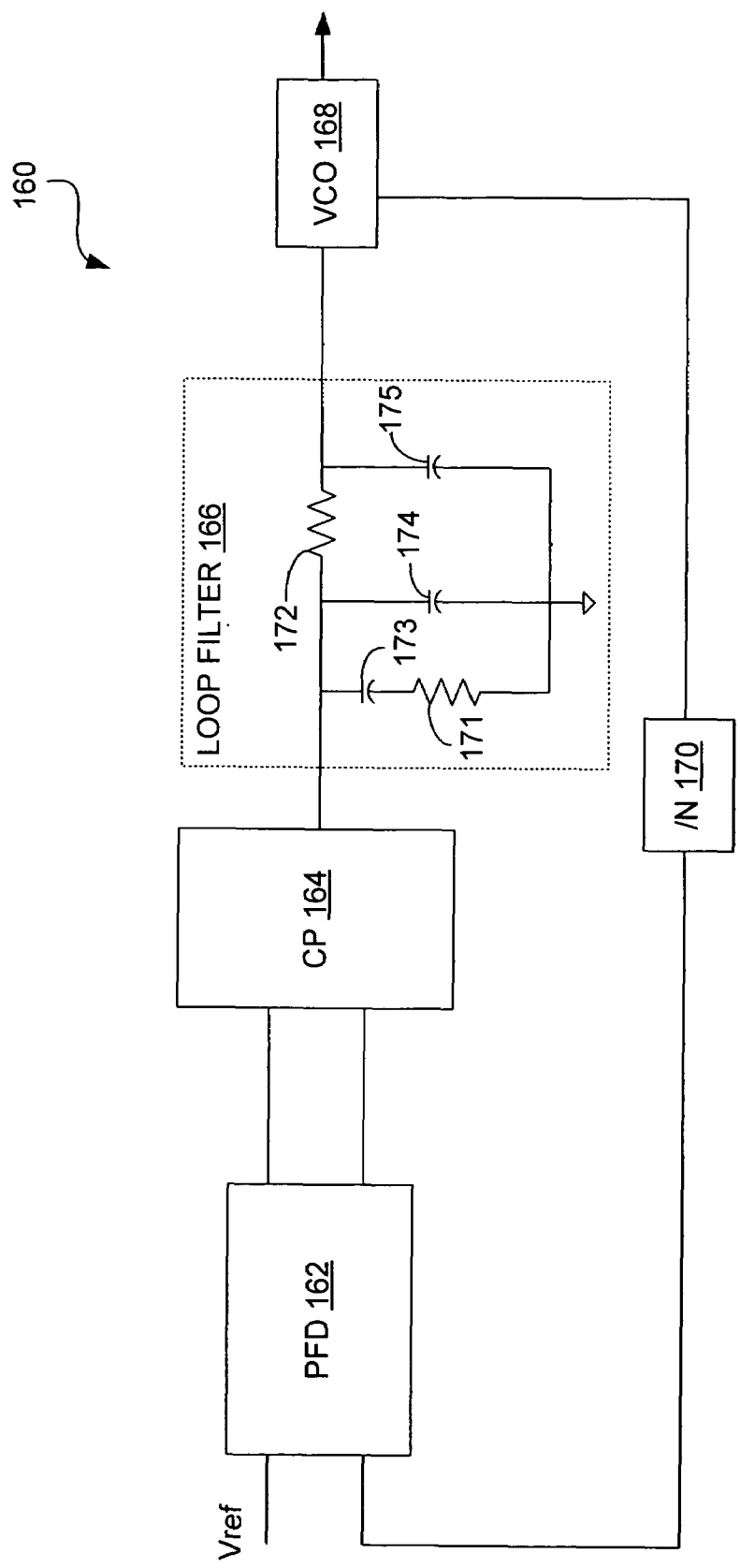
FIG. 1 is a block diagram illustrating one example conventional phase-locked loop.
Figure 2A:
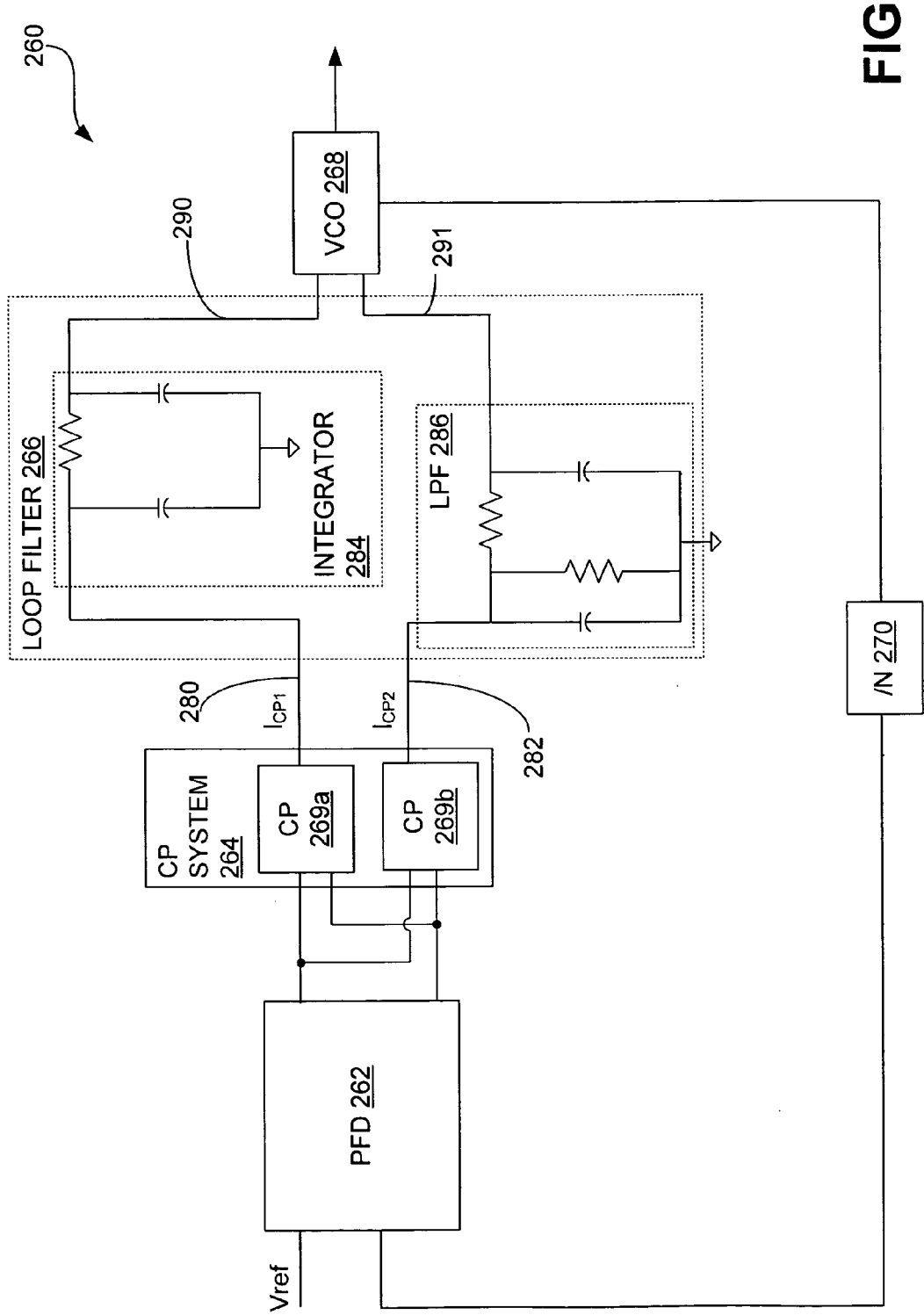
FIG. 2A is a block diagram illustrating a second example conventional phase-locked loop utilizing a dual-path filter.
Figure 2B:
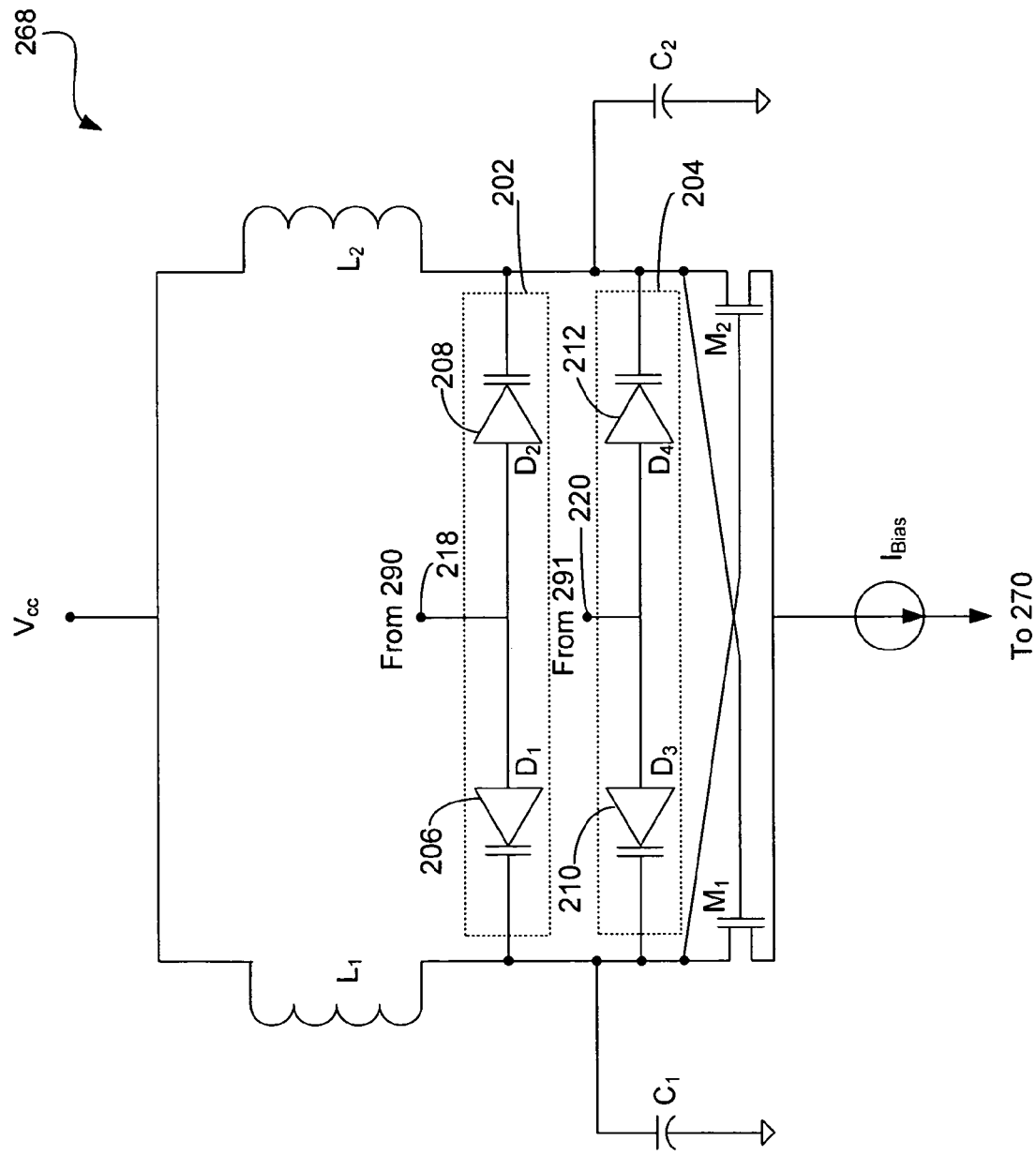
FIG. 2B is a schematic diagram of an example conventional voltage-controlled oscillator as shown in FIG. 2A.

The circuitry of the loop filter 466 enables similar performance characteristics (e.g., frequency response) as the conventional and dual loop configurations shown in FIGS. 1 and 2, respectively, but with a substantial reduction in the total capacitance of the phase-locked loop 360a when compared to the conventional phase-locked loop of FIG. 1. Additionally, no active devices are used to add the control signals of the integrator and LPF paths, thus reducing noise. Thus, the phase-locked loop 360a uses passive components to do the summation of the integrator and LPF paths. The weighted summation can easily be done by the ratio of the resistors 486 and 488 and capacitors 492 and 490, as described above. The weighted summation can be represented by a transfer function of the loop filter 466 determined through, among other techniques, computer-aided design tools.

Additionally, the VCO 468 of the phase-locked loop 360a includes only one set of varactors (not shown). This reduction in the number of varactor sets is made possible by a loop filter configuration that performs the summation in the loop filter 466. Thus, the loop filter 466 receives two current signals from the charge pump system 464, and provides a single output to the VCO 468 (e.g., provided to one varactor set of the VCO 468). Thus, only one set of back-to-back varactors is needed. There is no need to have two sets of weighted back-to-back varactors to perform summation of signals on the dual-paths, such as one for the integrator path and the other for the LPF path as used in conventional systems.

Note that other embodiments of the phase-locked loop 360 (FIG. 3) are contemplated, such as embodiments that omit the charge pump system 464 and replace the PFD 462 with a phase or frequency detector. For example, in embodiments that omit the charge pump system 464, voltage control signals can be output from a detector that could be filtered with a loop filter of like-configuration to loop filter 466 but configured for a voltage signal input versus a current signal input.

Figure 5:
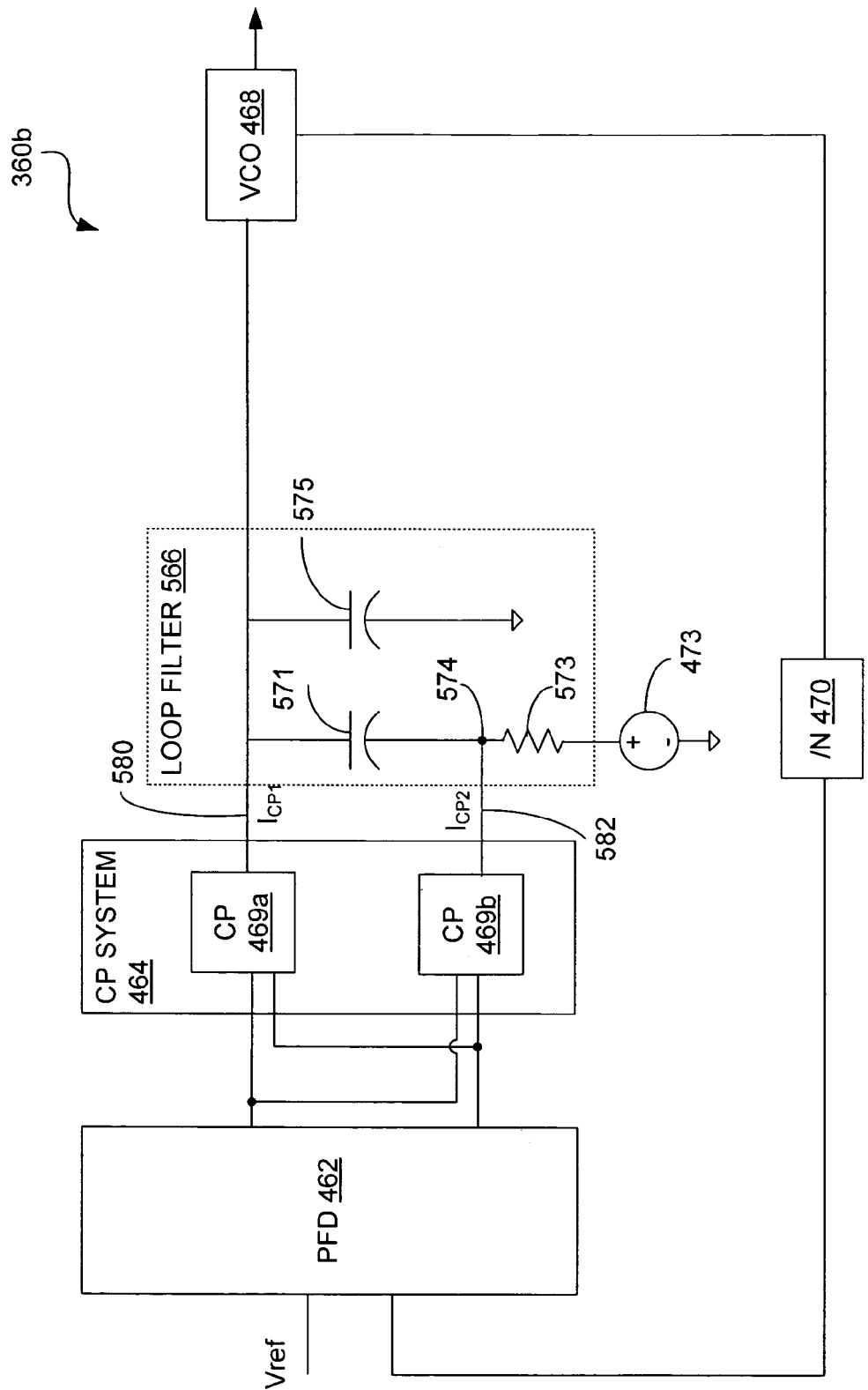
FIG. 5 is a block diagram illustrating another embodiment of the phase-locked loop of FIG. 3.

FIG. 5 is a block diagram illustrating another embodiment of the phase-locked loop 360 (FIG. 3). The phase-locked loop 360b includes like components to those described in the phase-locked loop 360a of FIG. 4, including the phase-frequency detector (PFD) 462, the charge pump system 464 having charge pump modules 469a and 469b, the voltage-controlled oscillator (VCO) 468, and further including a divide-by-N (/N) module 470, where N can be a fractional or integer value. In some embodiments, the divide-by-N module 470 can be replaced with a mixer as explained above. Similar to the phase-locked loop 360a of FIG. 4, the charge pump (CP) module 469b is in parallel with and preferably produces a larger current output value in current signal $I_{CP2}$ (e.g., ten times larger) than the current signal $I_{CP1}$ produced by charge pump (CP) module 469a. The current signals $I_{CP1}$ and $I_{CP2}$ have current values that are a ratio of each other. The loop filter 566 includes parallel capacitors 571 and 575, and a resistor 573 in series with capacitor 571. The output signal (e.g., current signal, $I_{CP2}$) of charge pump module 469b provided on connection 582 is provided to the resistor 573, which acts as a zero resistor.

The passive components of the loop filter 566 can be integrated on-chip by increasing the current across the resistor 573 and scaling back the current through the capacitors 571 and 575. By increasing the current through the resistor 573 as opposed to just increasing the resistance value, thermal noise can be reduced. Thus, the phase-locked loop 360b provides for a low-frequency zero by increasing the voltage across the resistor 573 using current signal $I_{CP2}$, while scaling back the current through capacitors 571 and 575. The effect of providing the output signal (e.g., $I_{CP2}$) of the charge pump module 469b to the resistor 573 is an amplification of the voltage across the resistor 573, which effectively amplifies the zero location. In other words, a larger voltage is created across the resistor 573 by increasing the current, $I_{CP2}$, driven across resistor 573 (as opposed to increasing the resistance of resistor 573, which can create thermal noise). The two paths for the current signals $I_{CP1}$ and $I_{CP2}$ are combined using passive components, unlike prior-art methods that combine paths in a voltage controlled oscillator or combine paths using active circuitry.

Although not shown, the loop filter 566 may be configured with circuitry disposed between capacitor 575 and the VCO 468 to create a high-frequency pole (e.g., similar to the resistor 494-capacitor 496 arrangement shown in FIG. 4).

Note that resistor 573 is disposed between node 574 and a voltage source 473. As explained above in association with FIG. 4, the bias voltage provided by the voltage source 473 can be provided by other mechanisms, and/or replaced with electrical ground in some embodiments.

While various embodiments of the phase-locked loop 360 (FIG. 3) have been described, it will be apparent to those of ordinary skill in the art that many more embodiments and implementations are possible that are within the scope of the disclosed phase-locked loop 360 and corresponding methods.

What is claimed is:

1. A semiconductor chip, comprising: a phase-locked loop including:
    a charge pump system comprising a first charge pump and a second charge pump configured to provide control signals comprising a first control signal and a second control signal, respectively, wherein the first control signal increases or decreases in magnitude concurrently with the second control signal; and
    a dual-path filter, the dual-path filter consisting of passive components that are configured to provide summation of the control signals, the dual-path filter further including a first node coupled between the first charge pump and a first capacitor and a second node coupled to the second charge pump through a first resistor, the second node also being connected to the first capacitor.

2. The chip of claim 1, further comprising a voltage source coupled to the second node through a second resistor.

3. The chip of claim 2, further comprising a third node coupled between the voltage source and the second resistor.

4. The chip of claim 3, further comprising a second capacitor coupled between the first capacitor and the third node.

5. The chip of claim 4, further comprising a third capacitor coupled between ground and the first resistor.

6. The chip of claim 1, further comprising an oscillator coupled to a single output connection corresponding to the dual-path filter, the single output connection configured to carry the summed control signals.

7. The chip of claim 1, further comprising an oscillator coupled to the dual-path filter, a detector coupled to the charge pump system, and a mixer or divide-by-N module coupled between the detector and the oscillator.

8. A method of operating a phase-locked loop, comprising:
    providing control signals comprising first and second control signals to a dual-path filter, the first control signal increasing or decreasing in magnitude concurrently with the second control signal; and
    at the dual-path filter: providing the first control signal to an integrator path and providing the second control signal at a low pass filter path; and summing the control signals corresponding to the integrator path and the low pass filter path, wherein the integrator path comprises a first resistor, a series capacitance arrangement, and a first node disposed between the first resistor and the series capacitance arrangement, wherein the low pass filter path comprises a second resistor, a third resistor, and a second node disposed between the second and third resistor, and a capacitor in parallel with the second and third resistor.

9. The method of claim 8, wherein providing the first control signal comprises providing a current signal of lesser magnitude than the second control signal.

10. The method of claim 8, wherein summing comprises connecting the third resistor to a capacitor of the series capacitance arrangement at the second node to provide a summed output signal at the first node.

* * * * *